United States Patent [19]

Schofield

[11] Patent Number: 4,511,867
[45] Date of Patent: Apr. 16, 1985

[54] ACOUSTIC SURFACE WAVE DEVICE INCLUDING A REFLECTIVE MULTISTRIP COUPLER

[75] Inventor: John Schofield, Coulsdon, England

[73] Assignee: U.S. Philips Corporation, New York, N.Y.

[21] Appl. No.: 510,094

[22] Filed: Jul. 1, 1983

[30] Foreign Application Priority Data

Jul. 5, 1982 [GB] United Kingdom ............... 8219372

[51] Int. Cl.³ .................. H03H 9/145; H03H 9/64
[52] U.S. Cl. .................. 333/195; 310/313 D; 333/153; 333/196
[58] Field of Search .................. 333/150–155, 333/193–196; 310/313 R, 313 A, 313 B, 313 C, 313 D

[56] References Cited

U.S. PATENT DOCUMENTS 3,947,783 3/1976 Maerfeld ............... 333/153
4,079,342 3/1978 Solie ............... 333/196

Primary Examiner—Marvin L. Nussbaum
Attorney, Agent, or Firm—Robert T. Mayer; Bernard Franzblau

[57] ABSTRACT

An acoustic surface wave device comprising a piezoelectric substrate provided with an input transducer (2), an output transducer (4) and a compact reflective multistrip coupler (6) in which the strips of each pair of comparatively widely spaced strips (7 or 8) in one array of mutually parallel strips are connected to respective strips of a pair of comparatively narrowly spaced strips (8 or 7) in the other array. The wide and narrow spacings alternate along each array. The improvement provides further electrodes 9 located in the relatively wide spaces in each array and electrically interconnected so as to effect a transfer of signal currents along each array and from one array to the other. The device improves efficiency, reduces insertion loss and improves the shape of the pass band.

15 Claims, 4 Drawing Figures

ACOUSTIC SURFACE WAVE DEVICE INCLUDING A REFLECTIVE MULTISTRIP COUPLER

This invention relates to an acoustic surface wave device comprising a piezoelectric substrate for propagating an acoustic surface wave at a surface thereof, transducer means for launching acoustic surface wave energy so as to propagate over said surface and for converting acoustic surface wave energy propagating over said surface into an electrical signal, and electrical coupling means for receiving acoustic surface wave energy propagating along a first propagation track and relaunching at least part of the energy as acoustic surface wave energy into a second propagation track, said electrical coupling means comprising a first array of electrically conductive strips across said first track and a second array of electrically conductive strips across said second track, each array including discrete parallel electrically conductive strips each of which is electrically insulated from the other said discrete conductive strips of that array and is electrically connected to a respective said discrete conductive strip of the other array in such a manner that the successive said discrete conductive strips of each array are electrically connected to the successive said discrete conductive strips of the other array, the centre-to-centre spacings of the successive said discrete conductive strips of each array being alternately relatively large and relatively small, the relatively large centre-to-centre spacing being approximately twice the relatively small centre-to-centre spacing, and the electrical connections between the said discrete conductive strips of the two arrays being such that, in each array, the said discrete conductive strips of each pair which have a said relatively large centre-to-centre spacing are connected to the respective strips of a pair in the other array which have a said relatively small centre-to-centre spacing. Such an acoustic surface wave device will be referred to herein as an acoustic surface wave device of the kind specified.

One form of a device of this kind is disclosed in U.K. Patent Specification No. 1,492,766 which relates to a coupler for a surface acoustic wave device for introducing or removing dispersion from a signal by reflecting signal components of different frequencies at different points along a surface acoustic wave delay line so that the reflected signals travel along a different path or track from the applied signals.

The process of track-changing is also employed in other surface acoustic wave devices, such as band-pass filters, in order to reduce the transfer of energy from the launching to the receiving transducer via the various bulk acoustic wave modes also launched by the type of interdigital transducers normally employed, and such devices commonly employ a form of multistrip coupler, for example as disclosed in U.K. Patent Specification No. 1,372,235. This form of coupler, when suitably proportioned, can transfer acoustic surface wave energy relatively efficiently to a second track in the same direction as that of the incident wave launched along the first track. However, a filter device using such an arrangement will occupy a considerable area on the surface of a piezoelectric crystal wafer making the device expensive to manufacture. This is especially significant in the case of relatively narrow band filter devices for use in frequency multiplex applications, such as for example in telephony, in which the attainment of a narrow band-width necessitates the use of relatively long arrays to provide the required selectivity.

Clearly, a more compact and therefore less expensive acoustic surface wave filter device could be manufactured if a reflective multistrip coupler could be provided having a sufficiently low insertion loss while providing a significant filtering effect.

A device including one form of reflective multistrip coupler, which may be used, for example, as a filter for an electrical signal applied to the transducer means, is known from a paper by M. Feldmann and J. Henaff entitled "A new multistrip acoustic surface wave filter" printed in the Proceedings of the IEEE Ultrasonics Symposium 1974 at pages 157–160. One such simple device is shown in diagrammatic form in FIG. 1 of the accompanying drawings and comprises a piezoelectric subtrate 1 for propagating an acoustic surface wave at a surface thereof, transducer means comprising an input transducer 2 for launching acoustic surface wave energy into a first propagation track (denoted by an arrow 3) at said surface and an output transducer 4 for converting acoustic surface wave energy propagating along a second track (denoted by an arrow 5) into an electrical signal, and electrical coupling means 6 for receiving acoustic surface wave energy propagating along the first track 3 and relaunching at least part of that energy as acoustic surface wave energy into the second track 5. The input and output transducers are both of the interdigital type, the electrical input signal being applied between the two sets of electrodes of the transducer 2 and the electrical output signal being taken off from across the two sets of electrodes of the transducer 4. The electrical couplings means 6 comprises a first array of electrically conductive strips across the first track 3 and a second array of electrically conductive strips across the second track 5. The first array comprises N discrete parallel electrically conductive strips 7 which are electrically insulated from each other and the second array comprises N discrete parallel electrically conductive strips 8 which are electrically insulated from each other. Each of the strips 7 is electrically connected to a respective one of the strips 8 in such manner that the successive strips of each array are connected to the successive strips of the other array. The strips 7 have equal centre-to-centre spacings $d_1$ and the strips 8 have equal centre-to-centre spacings $d_2$, where $d_1$ and $d_2$ are mutually different and satisfy the condition $d_1 + d_2 = n\lambda$, where n is an integer (e.g. unity) and $\lambda$ is the wavelength of an acoustic surface wave launched into the track 3 by the input transducer 2 or lying within a band of wavelenghts of acoustic surface waves launched into the track 3 by the input transducer 2. The centre-to-centre spacings of the strips making up the input and output transducers may be, for example $\lambda/4$ in the customary double-electrode configuration. As is known from the IEEE Symposium paper quoted above, because $d_1 + d_2 = n\lambda$ the multistrip coupler 6 is reflective for acoustic surface waves of wavelength $\lambda$, i.e. acoustic surface waves of wavelength $\lambda$ launched towards one end of the array of strips 7 by the transducer 2 will be relaunched (in practice in attenuated form) from the corresponding end of the array of strip 8. The value of $d_1$ is chosen to be different from $d_2$ because, if both were equal to $\lambda/2$, the condition $d_1 - d_2 = m\lambda$, where m is an integer zero, would also be satisfied and, as is known from another paper by M. Feldmann and J. Henaff entited "Design of Multistrip Arrays" printed in the Proceedings of the IEEE Ultrasonics Symposium 1977 at pages 686–690, this is the condition for the multistrip coupler 6 to be transmissive for acoustic waves of wavelength λ. As a result, a large proportion of the available acoustic wave energy would emerge from the right-hand side of the array of strips 8 and hence would not find its way to the output transducer 4.

The operational properties of the coupler 6 which are normally relevant in the device shown, in particular the bandwidth of its response and its insertion loss, are determined, inter alia, by the number N of strips 7 and 8 in the two arrays, these two quantities decreasing as the number N is increased. One disadvantage of the coupler 6 shown is that, if large values of the number N are required, as would be the case in order to provide an acceptably low insertion loss, and for a relatively narrow band filter, the electrical connections between the outer strips 7 and the corresponding strips 8 become very long. As these connections form a capacitive (and resistive) load this results in an increase in the insertion loss. Moreover the space between the array of strips 7 and the array of strips 8 occupied by these connections must then be kept quite broad, which results (a) in the electrical connections between the inner strips 7 and 8 being appreciably longer than they would otherwise be, and hence in a further increase in the insertion loss, and (b) in the waste of a part of the potentially useful surface area of the substrate 1.

To overcome these problems a coupling arrangement such as that shown in said Pat. No. GB 1,492,766 could be considered, however, the arrangement shown in FIG. 4 of that patent would be too expensive to manufacture because of the need for insulated cross-over connections, and the other arrangement shown in FIG. 5 of that patent would in practice be unsatisfactory because of significantly higher insertion loss and poor frequency response.

It is an object of the invention to provide an improved acoustic surface wave device of the kind specified.

The invention provides an acoustic surface wave device of the kind specified, characterized in that each array includes a plurality of further electrically conductive strips which are parallel to the said discrete conductive strips of that array, in that a further strip is situated between the respective discrete conductive strips forming substantially every pair having a said relatively large centre-to-centre spacing, and in that all said further electrically conductive strips in both said arrays are electrically interconnected.

The invention is based on the realisation that although the electrode arrays in a device of the kind specified could be rendered more uniform to the passage of acoustic surface waves along each track by interspersing one or more individual dummy electrodes within the gap between each relatively widely spaced pair of said discrete conductive strips in each array, an additional significant and unexpected improvement both in frequency discrimination and in the reduction of insertion loss can result from providing a common electrical interconnection to the interspersed (dummy) electrodes in both arrays so that they no longer merely serve the function of dummy electrodes but seem to have the effect of performing a signal-reinforcing function along the whole extent of the array at a frequency whose wavelength coincides with the periodicity of the relatively large centre-to-centre spacings along each array.

The result of this common electrical interconnection has been found, surprisingly, to be capable of reducing the insertion loss and of improving the frequency discrimination of a reflective multistrip coupler of a device of the kind specified because of the effect of a corresponding transfer of signal currents throughout the array via the common interconnection.

It is preferable that all the relatively large centre-to-centre spacings should be substantially equal to one another, and that all the relatively small centre-to-centre spacings should similarly be equal to one another. In order to provide the maximum effect of signal transfer along the whole of both arrays and hence an optimal amount of frequency discrimination and low insertion loss for a given length of array the relatively large centre-to-centre spacings should have a periodicity $\lambda_o$ along each array, where $\lambda_o$ is the acoustic surface wavelength at the mid-band frequency $f_o$ of the device.

In one embodiment of the invention a single further strip is located between the discrete conductive strips of each pair having the relatively large centre-to-centre spacing.

As mentioned previously, the condition for reflection is $d_1+d_2=\lambda n$ and in one example of the embodiment, $d_1=\lambda/3$ and $d_2=2\lambda/3$.

It may or may not be desirable in a particular case that the sums of the spacings of each two pairs of interconnected strips should be the same, i.e. correspond to the same value of λ. It may be, for example, that these sums should be arranged to steadily increase on going from one end of each array to the other, i.e. to correspond to steadily increasing values of λ in order to obtain a required frequency response of the device.

It will be apparent that the presence of the strips will affect the surface properties of the piezoelectric substrate as seen by an acoustic surface wave travelling at its surface. It is therefore preferable that, in each array, the discrete conductive strips and the further strips should be uniformaly spaced along the array and should present a constant mark-to-space ratio and surface loading in respect of applied conductive material.

It should be noted that the common interconnection can either be connected to a steady potential, such as ground, and this may be preferable for some applications, or it can remain unconnected so as to float electrically in a manner similar to the remainder of the array electrodes. A slight difference in the frequency response may be found as between these alternatives arrangements. However, both can provide a reduction in insertion loss and a more compact reflective multistrip coupler than the prior art devices.

Embodiments of the invention will now be described by way of example, with reference to the accompanying diagrammatic drawings, in which.

Corresponding components are denoted by the same reference numerals in the various Figures.

Figure 1:
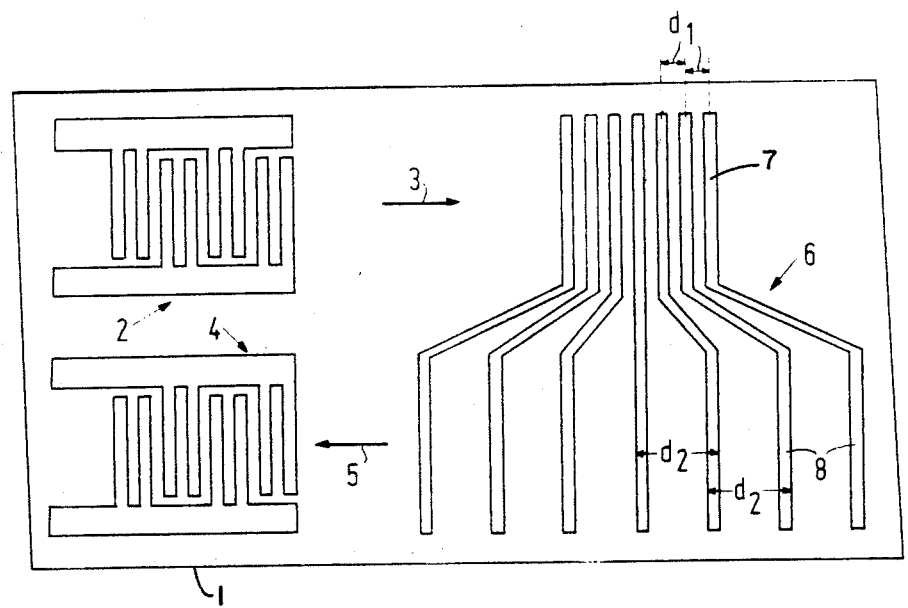
FIG. 1 shows a known device already discussed.
Figure 2:
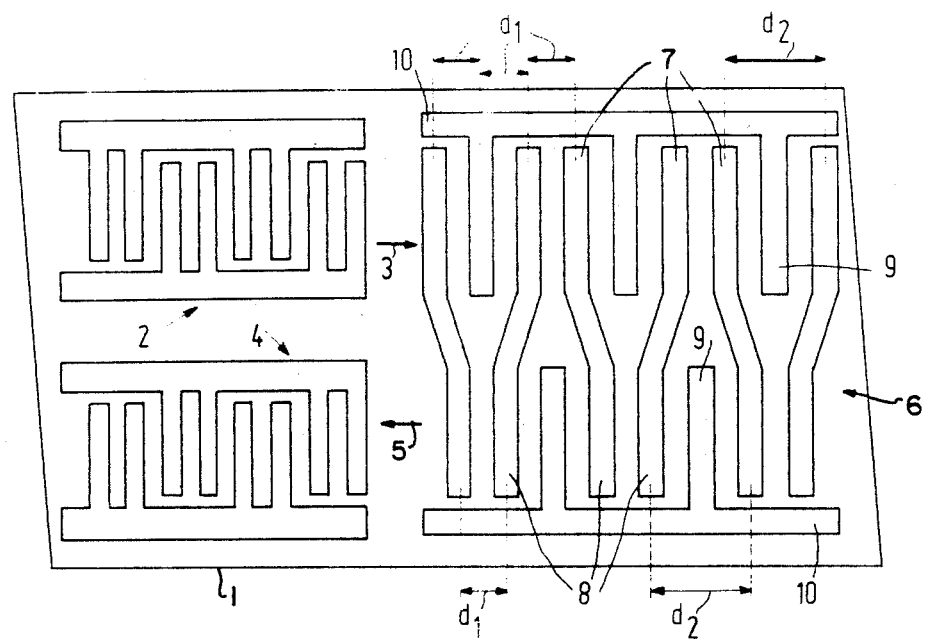
FIG. 2 shows an embodiment of the invention.

In FIG. 2 an acoustic surface wave device comprises, similarly to the device of FIG. 1, a piezoelectric substrate 1 for propagating an acoustic surface wave at a surface thereof, transducer means comprising an input transducer 2 for launching acoustic surface wave energy into a first propagation track (denoted by an arrow 3) at said surface and an output transducer 4 for converting acoustic wave energy propagating along a second track (denoted by an arrow 5) into an electrical signal, and electrical coupling means 6 for receiving acoustic surface wave energy propagating along the first track 3 and relaunching at least part of that energy as acoustic surface wave energy into the second track 5. Again the electrical coupling means 6 comprises a first array of electrically conductive strips across the first track 3 and a second array of electrically conductive strips across the second track 5. The first array again comprises N discrete parallel electrical conductive strips 7 which are electrically insulated from each other and the second array again comprises N discrete parallel electrical conductive strips 8 which are electrically insulated from each other. Again each of the strips 7 is electrically connected to a respective one of the strips 8 so that the successive said strips of each array are connected to the successive strips of the other array. However, now the centre-to-centre spacings of the strips 7 alternate between $d_1$ and $d_2$, as do the centre-to-centre spacings of the strips 8, $d_1$ and $d_2$ again being mutually different. In fact $d_2=2d_1$ in the device shown in FIG. 2, and $d_1$ and $d_2$ satisfy the condition $d_1+d_2=n\lambda$, where n is an integer (e.g. unity) and $\lambda=\lambda_o$ where $\lambda_o$ is the wavelength at the mid-frequency $f_o$ of the pass-band of the device, or $\lambda$ can be a wavelength lying within a band of wavelengths of acoustic surface waves launched into the tracks 3 by the input transducer 2 in operation. The electrical connections between the strips 7 and 8 are such that, in each array, each pair of strips which have a centre-to-centre spacing of $d_2$ are connected to the respective strips of a pair in the other array which have a centre-to-centre spacing $d_1$. The device of FIG. 2 operates in a similar manner to that of FIG. 1, a portion of the acoustic surface wave energy of wavelength approximately $\lambda$ incident on the array of strips 7 covering track 3 being relaunched into track 5 by the array of strips 8, but the total length of the coupling means 6 in the direction of the track 3 is, in the device of FIG. 2, significantly less than the corresponding length of the coupling means 6 in FIG. 1.

It should be understood that, for the sake of clarity in representation, the drawings only show each array as being made up of a small number N of strips. In practice this would cause the insertion loss to be too great on the substrate materials normally used. In order to provide an acceptable low insertion loss for a commercially useful device N would have to be much larger, for example 150 to 200 for 128°-cut or Y-cut lithium niobate, although it may be possible to use as few as 20 to 30 strips on the high-coupling 41°-rotated cut of lithium niobate. It will therefore be apparent that in a practical case in which N can range from 20 to 200, the coupling means 6 of the device of FIG. 2 will be very much shorter than the coupling means 6 of FIG. 1, resulting in less waste of the available surface area of the substrate, and in a smaller device.

Moreover, in contradistinction to the coupler 6 of FIG. 1, in the coupler 6 of FIG. 2 all the electrical connections between the strips 7 and the strips 8 are of the same length however many strips 7 and 8 are provided, and this length is certainly no more than, and for large numbers of strips considerably less than, the minimum corresponding length in the coupler of FIG. 1, which can be of advantage as regards simplicity of manufacture and in the interests of reducing the insertion loss of the coupler 6. So far the device is similar to the reflective coupler shown in FIG. 5 of U.K. Patent Specification No. 1,492,766.

In accordance with the invention a further electrically conducting strip is situated between the respect strips 7 or 8 forming substantially every pair having a relatively wide centre-to-centre spacing $d_2$. These further strips are electrically interconnected, and can if desired be connected to a point of constant pontential, for example ground. The presence of a single such further strip between each pair of strips 7 or 8 which have the large spacing $d_2$ will give the desired result when $d_2=2d_1$, as shown in the embodiment of FIG. 2, and such a further electrically conductive strip 9 is provided between and parallel to each pair of strips 7 and 8 which have the larger centre-to-centre spacings $d_2$ in such manner that the centre-to-centre spacing between each further strip and each of the strips 7, 8 adjacent thereto is equal to $d_2/2$. This configuration allows the piezoelectric substrate 1 to appear as homogenous as possible to the acoustic surface wave propagating in the track 3, 5 under the arrays of strips. The further strips 9 preferably have the same widths as the strips 7 and 8, which widths may be equal to $d_1/2$ in order to give a "mark-to-space" ratio of unity on going along each array. The strips of each of the two resulting sets of further strips 9 are electrically interconnected by means of an auxiliary strip conductor 10 extending perpendicular thereto in the manner shown, and the auxiliary strips are furthermore interconnected, for example in that they are connected to a constant potential point (not shown), for example ground.

Figure 3:
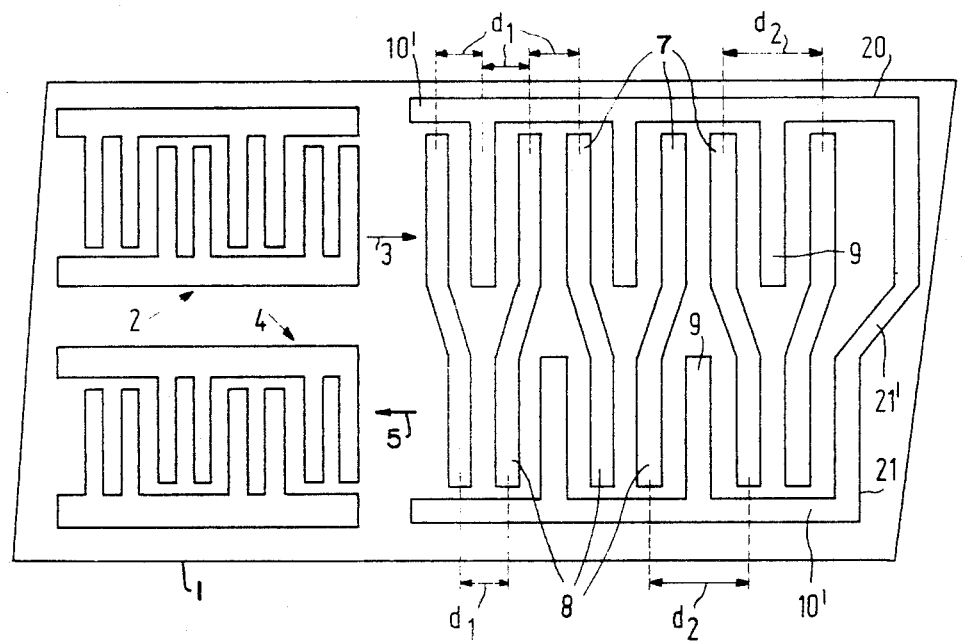
FIG. 3 shows a practical example of the embodiment.

FIG. 3 shows a practical example of the embodiment of FIG. 2 in which the electrical interconnection of the further electrically conductive strips 9 in both arrays is provided by a common electrical conductor 20 in the form of respective strip-like portions 10' disposed along the outer edge of a corresponding array and arranged parallel to the acoustic surface wave propagation direction along that array, and a linking electrically conducting strip-like portion 21 disposed across an end of the electrical coupling means 6. The strip-like portion 21 should not disturb the transducing relationship between the surface waves propagating in each of the arrays and the potential on the further strips 9 to which it is connected, and this condition is satisfied in FIG. 3 by causing the conductor 21 to occupy the position that the next further strip 9 would have occupied at the end of the respective array if it had been present, and also to comprise a central connecting portion 21' between the surface wave tracks.

Figure 4:
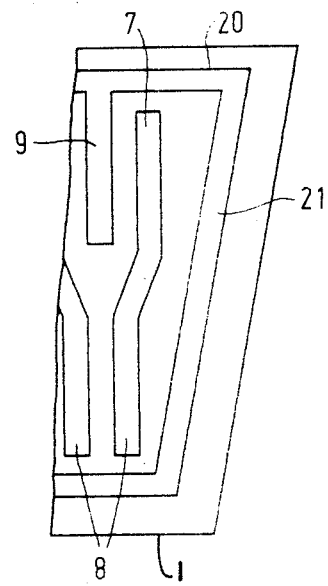
FIG. 4 shows an alternative form of interconnecting arrangement for use in FIG. 3.

FIG. 4 is a detail illustrating an alternative form for the linking conductor portion 21 in which the strip is inclined at an angle to strips 7, 8 and 9 so that it will not be coherent with the wavefront of a desired surface wave propagating in either array and therefore transduction or reflection thereby of undesired surface wave components will be substantially prevented with respect to the surface wave propagation track direction through the respective arrays.

It will be appreciated that the devices of FIGS. 2 and 3 are only examples of many possible embodiments of the invention . For example the number of interdigitated electrodes in the input and/or output transducers 2 and 4 may be different to that shown, as may be the number of strips 7 and 8 included in each array making up the coupling means 6. As another example the construction of the input and output transducers 2 and 4 may be different to that shown and may be apodized in conventional manner in order to provide a desired passband response. Usually, however, the sum of the centre-to-centre spacing of each adjacent pair of strips 7 or 8 in one array and the centre-to-centre spacing of the pair of strips 8 or 7 in the other array to which these strips are connected will be substantially the same (preferably equal to λ) for all such interconnection pairs, although in particular applications it may be that even these sums vary, preferably in a smooth manner, along the length of the coupler 6. Even if the ratio of $d_2$ to $d_1$ is nominally two as in FIGS. 2 and 3, it need not be exactly so. It may for example be within the range 1.50 to 2.70 or within the range 1.70 to 2.34, there being only a gradual deterioration in performance as the preferred value of two is departed from.

The strips 7 and 8 may be apodized in known manner, if desired, though this can only in general be carried out if the corresponding transducer 2, 4 is not apodized.

Although the strips 7 and the interspersed strips 9 are shown parallel to the strips 8 and the interspersed strips 9 making the tracks 3 and 5 parallel to each other, this is not essential. The mutually parallel strips 8 and their interspersed strips 9 may be at an angle to the mutually parallel strips 7 and their interspersed strips 9 if desired, in which case the tracks 3 and 5 will no longer be mutually parallel. It should be noted in FIGS. 2 and 4 that because the conductors 7 and 9, or 8 and 9, are spaced centre-to-centre by, nominally, one third of a wavelength at the centre frequency of the pass-band, the reflective multistrip coupler 6 will tend to reject the third harmonic of that frequency.

The acoustic surface wave propagation path from the input transducer 2 to the output transducer 4 may be arranged to encounter more than one coupler 6 if desired so that, for example, the path comprises more than two mutually parallel tracks. As another example two couplers 6 may be provided on the substrate 1 in such manner that the input track 3 of each is constituted by the output track portion 5 of the other, in which case a single combined input/output transducer may be situated at some point on the resulting closed complete path, thereby forming a resonator.

It should be understood that while FIGS. 2 and 3 illustrate examples in accordance with the invention, in which a further strip 9 is situated between each pair of strips 7 or 8 which have a relatively wide centre-to-centre spacing, the advantages of the invention can nevertheless be provided when the further strips are not present in some, namely at most about 20%, of the relatively wide centre-to-centre spacings of either array, and this may sometimes be desired in order to modify the transfer response of the reflective coupler.

While reference is made herein to reflective multistrip couplers being relatively narrow band-width devices and therefore particularly suitable for filtering frequency multiplex communication channels, the band width achieved will depend on the length of the arrays in the coupler and the use of a high coupling piezoelectric substrate, such as lithium niobate, can enable an array to be manufactured which can be entirely satisfactory for use in television filtering applications, especially those in which the fractional bandwidth can be kept small, for example in cable television, satellite television receivers and community antenna apparatus.

I claim:

1. An acoustic surface wave device comprising a piezoelectric substrate for propagating an acoustic surface wave at a surface thereof, transducer means for launching acoustic surface wave energy so as to propagate over said surface and for converting acoustic surface wave energy propagating over said surface into an electrical signal, and electrical coupling means for receiving acoustic surface wave energy propagating along a first propagation track and relaunching at least part of that energy as acoustic surface wave energy along a second propagation track, said electrical coupling means comprising a first array of electrically conductive strips across said first track and a second array of electrically conductive strips across said second track, each array including discrete parallel electrically conductive strips each of which is electrically insulated from the other said discrete conductive strips of that array and is electrically connected to a respective said discrete conductive strip of the other array such that the successive said discrete conductive strips of each array are electrically connected to the successive said discrete conductive strips of the other array, the centre-to-centre spacings of the successive said discrete conductive strips of each array being alternately relatively large and relatively small, the relatively large centre-to-centre spacing being aproximately twice the relatively small centre-to-centre spacing, the said discrete conductive strips of the two arrays being interconnected such that, in each array, the said discrete conductive strips of each pair which have a said relatively large centre-to-centre spacings are connected to the respective strips of a pair in the other array which have a said relatively small centre-to-centre spacing, characterized in that each array includes a plurality of further electrically conductive strips which are parallel to the said discrete conductive strips of that array, in that a further strip is situated between the respective discrete conductive strips forming substantially every pair having a said relatively large centre-to-centre spacing, and in that all said further electrically conductive strips in both said arrays are electrically interconnected.

2. A device as claimed in claim 1, characterized in that a said further electrically conductive strip is situated between the discrete conductive strips of each pair of strips having a relatively large centre-to-centre spacing.

3. A device as claimed in claim 1 or claim 2, characterized in that said interconnected further electrically conductive strips are connected to a constant potential.

4. A device as claimed in claims 1 or 2, characterized in that all of the said relatively large centre-to-centre spacings are substantially equal to each other, as are all of the said relatively small centre-to-centre spacings.

5. A device as claimed in claim 1 characterized in that said relatively large centre-to-centre spacings have a periodicity of $\lambda_o$ along each array, where $\lambda_o$ is the acoustic surface wavelength at the mid-band frequency $f_o$ of the device.

6. A device as claimed in claim 1 characterized in that in each said array said discrete conductive strips and said further strips are substantially uniformly spaced along the array.

7. A device as claimed in claim 6, characterized in that a single said further strip is located between the discrete conductive strips of each pair having a said relatively large centre-to-centre spacing.

8. A device as claimed in any one of claims 1, 5 or 6, characterized in that an electrical interconnection of said further electrically conductive strips comprises a common electrical conductor in the form of respective strip-like portions disposed along the outer edge of a corresponding array and parallel to the acoustic surface wave propagation direction along that array, and a linking electrically conducting strip-like portion disposed across an end of said electrical coupling means and arranged so that substantially no undesired surface acoustic wave signal is transduced thereby in the propagation direction along either array.

9. A device as claimed in claim 3 wherein all of said relatively large centre-to-centre spacings are substantially equal to each other and all of said relatively small centre-to-centre spacings are substantially equal to each other.

10. A device as claimed in claim 1 further comprising means connecting said interconnected further electrically conductive strips to a point of constant potential and wherein said relatively large centre-to-centre spacings have a periodicity of $\lambda_o$ along each array, where $\lambda_o$ is the acoustic surface wavelength at mid-band frequency $f_o$ of the device.

11. A device as claimed in claim 1 further comprising means connecting said interconnected further electrically conductive strips to a point of constant potential and wherein in each said array said discrete conductive strips and said further strips are substantially uniformly spaced along the array.

12. A device as claimed in claim 1 wherein the discrete conductive strips and the further conductive strips in each array are uniformly spaced along the respective arrays so as to provide a constant mark-to-space ratio along each array.

13. A deviced as claimed in claim 1 wherein said first and second arrays of electrically conductive strips satisfy the condition that $d_1 + d_2 = n\lambda$, where $d_1$ and $d_2$ are the relatively small and relatively large centre-to-centre spacings, respectively, of the conductive strips in said first and second arrays of strips, $\lambda$ is the wavelength of an acoustic surface wave propagating in said device, and n is an integer.

14. A device as claimed in claim 13 wherein $d_1 = \lambda/3$ and $d_2 32 2\lambda/3$.

15. A device as claimed in claim 13 wherein the discrete conductive strips of the first array are electrically connected to the discrete conductive strips of the second array so that, in each array, each pair of conductive strips with a centre-to-centre spacing of $d_2$ are connected to respective conductive strips of a pair of conductive strips in the other array having a centre-to-centre spacing of $d_1$.

* * * * *

UNITED STATES PATENT AND TRADEMARK OFFICE
CERTIFICATE OF CORRECTION

PATENT NO. : 4,511,867
DATED : April 16, 1985
INVENTOR(S) : JOHN SCHOFIELD

It is certified that error appears in the above-identified patent and that said Letters Patent is hereby corrected as shown below:

In the Claims:

Claim 1, line 31, change "spacings" to --spacing--

Claim 14, line 2, change "$d_2$ 32 $2\lambda/3$" to
--$d_2 = 2\lambda/3$--

Signed and Sealed this

Fourth Day of March 1986

[SEAL]

Attest:

DONALD J. QUIGG

Attesting Officer    Commissioner of Patents and Trademarks